United States Patent
He et al.

(10) Patent No.: US 12,556,149 B2
(45) Date of Patent: Feb. 17, 2026

(54) CALIBRATION OF FULLY-DIFFERENTIAL INPUT SYSTEM

(71) Applicant: Cirrus Logic International Semiconductor Ltd., Edinburgh (GB)

(72) Inventors: Zhaohui He, Austin, TX (US); Neel Pramanik, Austin, TX (US); Lingli Zhang, Austin, TX (US); Wei Xu, Austin, TX (US); Prashanth Drakshapalli, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 690 days.

(21) Appl. No.: 17/848,550

(22) Filed: Jun. 24, 2022

(65) Prior Publication Data
US 2023/0122151 A1 Apr. 20, 2023

Related U.S. Application Data

(60) Provisional application No. 63/257,336, filed on Oct. 19, 2021.

(51) Int. Cl.
*H03F 3/45* (2006.01)
(52) U.S. Cl.
CPC ............ *H03F 3/45475* (2013.01); *H03F 2203/45048* (2013.01); *H03F 2203/7231* (2013.01)
(58) Field of Classification Search
CPC ....... H03F 3/45475; H03F 2203/45048; H03F 2203/7231; H03F 3/183; H03F 2200/462; H03G 2201/106
USPC ........................................................ 330/107
See application file for complete search history.

(56) References Cited

U.S. PATENT DOCUMENTS

| | | | |
|---|---|---|---|
| 10,132,844 B2 | 11/2018 | Parupalli et al. | |
| 10,972,061 B2 | 4/2021 | He et al. | |
| 2008/0297253 A1* | 12/2008 | Li | H03F 1/34 330/258 |
| 2012/0044006 A1* | 2/2012 | Kao | H03F 3/45928 327/307 |
| 2016/0034094 A1 | 2/2016 | Kang et al. | |
| 2023/0122151 A1* | 4/2023 | He | H03F 3/183 330/252 |

OTHER PUBLICATIONS

International Search Report and Written Opinion of the International Searching Authority, International Application No. PCT/US2022/046403, mailed Feb. 8, 2023.

* cited by examiner

*Primary Examiner* — Andrea Lindgren Baltzell
*Assistant Examiner* — Jose E Pinero
(74) *Attorney, Agent, or Firm* — Jackson Walker L.L.P.

(57) ABSTRACT

A method for calibrating a fully-differential input system may include determining a first voltage of a first node of the fully-differential input system, wherein the first node is coupled at the first node to a plurality of first resistors in a first star configuration, determining a second voltage of a second node of the fully-differential input system, wherein the second node is coupled at the second node to a plurality of second resistors in a second star configuration, each resistor of the plurality of second resistors corresponding to a respective resistor of the plurality of first resistors, and trimming individual resistances of the plurality of first resistors and the plurality of second resistors in order to maintain a difference of a first voltage at the first node and a second voltage of the second node at approximately zero.

12 Claims, 4 Drawing Sheets

CALIBRATION OF FULLY-DIFFERENTIAL INPUT SYSTEM

RELATED APPLICATION

The present disclosure claims priority to U.S. Provisional Patent Application Ser. No. 63/257,336, filed Oct. 19, 2021, which is incorporated by reference herein in its entirety.

FIELD OF DISCLOSURE

The present disclosure relates in general to fully-differential input systems, such as current sense amplifiers, for example. More specifically, the present disclosure relates to enhanced common mode rejection in current sense amplifiers and other fully-differential input systems.

BACKGROUND

A current sense amplifier system may sense a current using a small sense resistor to generate a small sense voltage that is proportional to the sensed current. An amplifier of the current sense amplifier system is then used to amplify the small sense voltage. An example of such a system is shown in FIG. 1. FIG. 1 illustrates a schematic block diagram of a conventional current sense amplifier system 100, as is known in the art. As illustrated in FIG. 1, a current being sensed by current sense amplifier system 100 corresponds to a current flowing through speaker 102. Current sense amplifier system 100 may also include an analog-to-digital converter (ADC) 104 to convert the analog sensed voltage signal to a digital sensed voltage signal suitable for digital post-processing.

Numerous drawbacks are associated with conventional current sense amplifier system 100 of FIG. 1, and others. For example, a common mode voltage feed through may occur due to a mismatch between input resistors 108A and 108B or a mismatch between input resistors 108 and feedback resistors 110. The problem may be exacerbated by the fact that the sense voltage is small compared to the common mode voltage, such that even a slight mismatch between resistors can result in a common mode feed-through voltage that is a significant percentage of the sense voltage.

SUMMARY

In accordance with the teachings of the present disclosure, the disadvantages and problems associated with common mode performance in a fully-differential input system may be reduced or eliminated.

In accordance with embodiments of the present disclosure, a method for calibrating a fully-differential input system may include determining a first voltage of a first node of the fully-differential input system, wherein the first node is coupled at the first node to a plurality of first resistors in a first star configuration, determining a second voltage of a second node of the fully-differential input system, wherein the second node is coupled at the second node to a plurality of second resistors in a second star configuration, each resistor of the plurality of second resistors corresponding to a respective resistor of the plurality of first resistors, and trimming individual resistances of the plurality of first resistors and the plurality of second resistors in order to maintain a difference of a first voltage at the first node and a second voltage of the second node at approximately zero.

In accordance with these and other embodiments of the present disclosure, a system for calibrating a fully-differential input system may include a first input for receiving a first voltage of a first node of the fully-differential input system, wherein the first node is coupled at the first node to a plurality of first resistors in a first star configuration, and a second input for receiving a second voltage of a second node of the fully-differential input system, wherein the second node is coupled at the second node to a plurality of second resistors in a second star configuration, each resistor of the plurality of second resistors corresponding to a respective resistor of the plurality of first resistors. The system may also include a calibration system configured to trim individual resistances of the plurality of first resistors and the plurality of second resistors in order to maintain a difference of a first voltage at the first node and a second voltage of the second node at approximately zero.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers, and acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use in proximity detection type applications and/or machine-to-machine communication.

Many electronic devices may additionally or alternatively include more specialized acoustic output transducers, for example, haptic transducers, tailored for generating vibrations for haptic control feedback or notifications to a user. Additionally or alternatively, an electronic device may have a connector, e.g., a socket, for making a removable mating connection with a corresponding connector of an accessory apparatus and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic or haptic transducers, the driving signal will generally be an analog time varying voltage signal, for example, a time varying waveform.

Figure 1:
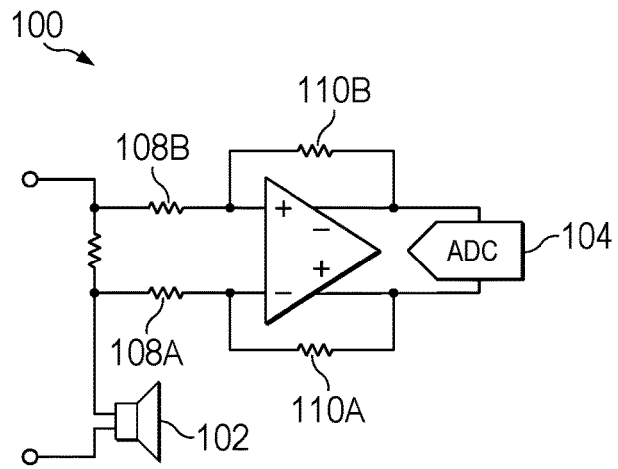
FIG. 1 illustrates a schematic block diagram of a conventional current sense amplifier system, as is known in the art.
Figure 2:
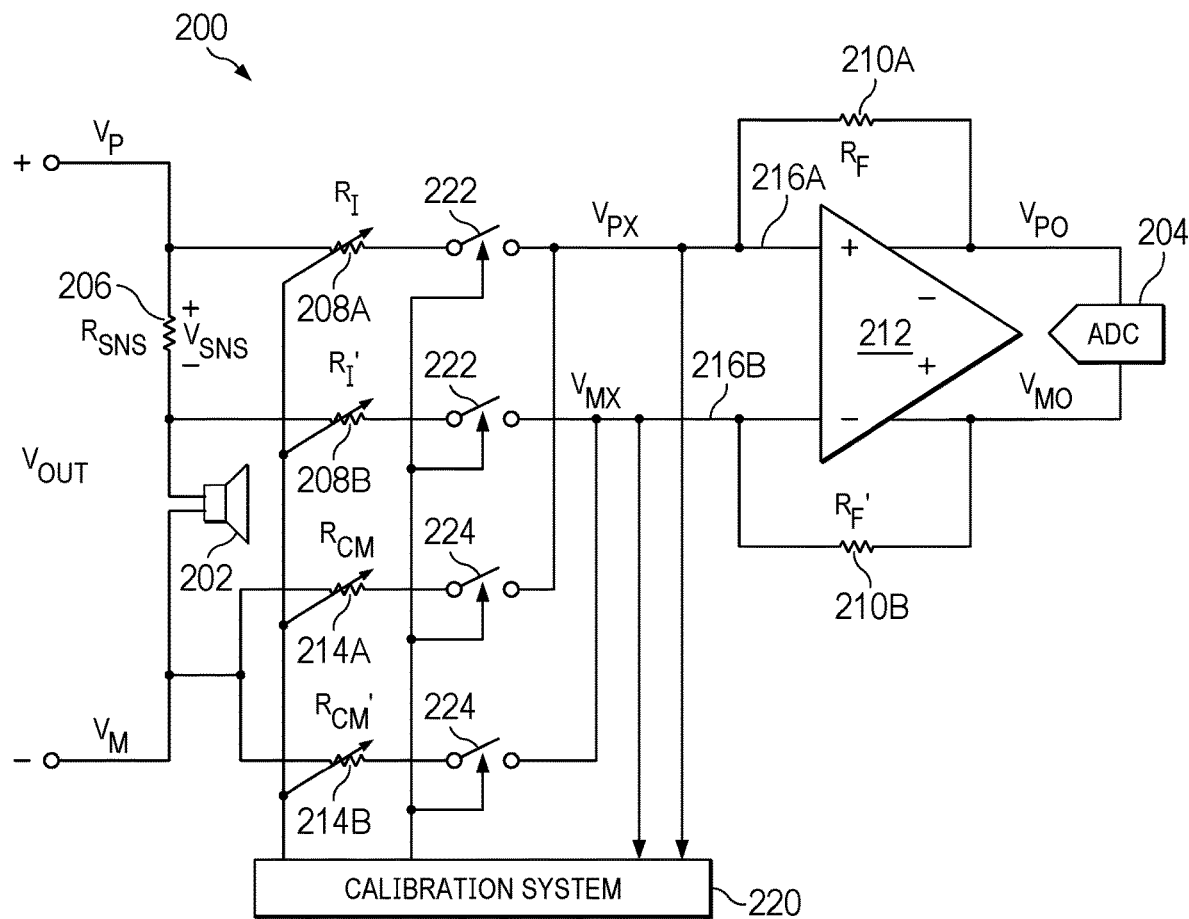
FIG. 2 illustrates a schematic block diagram of a current sense amplifier system, in accordance with the present disclosure.

FIG. 2 illustrates a schematic block diagram of a current sense amplifier system 200, in accordance with the present disclosure. Current sense amplifier system 200 may sense a current flowing through device 202, such as a speaker, microphone, haptic actuator, other transducer, or any other device through which current may flow. In some embodiments, current sense amplifier system 200 may be implemented as a stand-alone circuit, as logic circuitry in a programmable device, or within a controller integrated circuit (IC).

Current sense amplifier system 200 may include an ADC path configured to measure a current value. Such ADC path may include an amplifier 212 coupled to a sense resistor 206. If the ADC path including amplifier 212 were uncoupled from the terminals of sense resistor 206, then sense resistor 206 would be in series with device 202. According to some embodiments, sense resistor 206 may have a small resistance $R_{SNS}$, such as a resistance $R_{SNS}$ less than 10 ohms or as small or smaller than 1 ohm or 0.5 ohm. Thus, a sense voltage $V_{SNS}$ across sense resistor 206 generated based on a measured current through device 202 may be a small signal voltage, in some configurations having an amplitude smaller than a common mode voltage present at the nodes of sense resistor 206.

Current sense amplifier system 200 may be coupled to the nodes of sense resistor 206 to measure sense voltage $V_{SNS}$ across sense resistor 206 and process sense voltage $V_{SNS}$ with amplifier 212 and ADC 204. For example, current sense amplifier system 200 may include a first input resistor 208A coupled between sense resistor 206 and a first input terminal 216A of amplifier 212 and a second input resistor 208B coupled between sense resistor 206 and a second input terminal 216B of amplifier 212. Second resistor 208B may have a variable resistance $R_I'$ approximately equal to a variable resistance $R_I$ of first input resistor 208A.

Current sense amplifier system 200 may also include additional resistors to perform various operations on the sensed voltage of sense resistor 206. For example, current sense amplifier system 200 may include feedback resistors 210A and 210B having resistances $R_F$ and $R_F'$ (wherein $R_F \approx R_F'$), respectively, to implement a gain function. The combination of amplifier 212, input resistors 208A and 208B, and feedback resistors 210A and 210B may amplify sense voltage $V_{OUT}$ across sense resistor 206 to output to ADC 204 an amplified version of the voltage sensed across sense resistor 206. One of skill in the art may readily recognize that the particular gain function illustrated in FIG. 2 using amplifier 212, input resistors 208A and 208B, and feedback resistors 210A and 210B is but one embodiment of an amplifying stage which may be used in current sense amplifier system 200. For example, more or fewer resistors may be used in collaboration with amplifier 212 to perform other gain functions in current sense amplifier system 200.

ADC 204 may be coupled to an output of amplifier 212 and configured to provide a digital value to other processing circuitry for further processing beyond the scope of this disclosure. The digital value output by ADC 204 may be representative of the voltage across sense resistor 206 generated based on the measured current value.

In some embodiments, the voltage value presented to ADC 204 by amplifier 212 may also include a common mode feed through voltage $\Delta V_{CM}$. For example, common mode feed through voltage $\Delta V_{CM}$ may appear at the output of amplifier 212 as a result of mismatch between input resistors 208A and 2008B or between feedback resistors 210A and 210B. As another example, common mode feed through voltage $\Delta V_{CM}$ may appear at the output of amplifier 212 as a result of operational amplifier device mismatch.

To combat common mode feed through voltage $\Delta V_{CM}$ resulting from amplifier mismatch, a first variable common mode resistor 214A having resistance $R_{CM}$ may be coupled between a second terminal of sense resistor 206 and first input terminal 216A and a second variable common mode resistor 214B having resistance $R_{CM}' \approx R_{CM}$ may be coupled between the second terminal of sense resistor 206 and second input terminal 216B. The presence of common mode resistors 214 form a common mode sensing path that propagates a common-mode correction to the input terminals of amplifier 212, that may minimize an amount of common mode feed through voltage $\Delta V_{CM}$ propagated from ADC 204 to subsequent processing blocks. Functionally speaking, the common-mode resistor pair of common mode resistors 214A and 214B may (assuming $R_F \approx R_{CM}$ and $R_I' \approx R_{CM}'$) halve the effective input common-mode impedance as opposed to feedback resistors 210A and 210B, and therefore a major portion of input common-mode voltage $\Delta V_{CM}$ would drop across feedback resistors 210A and 210B, rather than the equivalency of input resistors 208 and common mode resistors 214, thus minimizing overall circuit total harmonic distortion (THD) sensitivity to resistor mismatches would drop across feedback resistors 210A and 210B rather than the equivalency of input resistors 208A/208B and common mode resistors 214A/214B, and may reduce overall circuit THD sensitivity to the mismatch of input resistors 208 and/or common mode resistors 214.

By minimizing the amount of common mode feed through voltage $\Delta V_{CM}$ propagated to subsequent processing blocks, the digital voltage signal propagated to subsequent processing blocks may more accurately represent an amplified version of sense voltage $V_{SNS}$.

Figure 3:
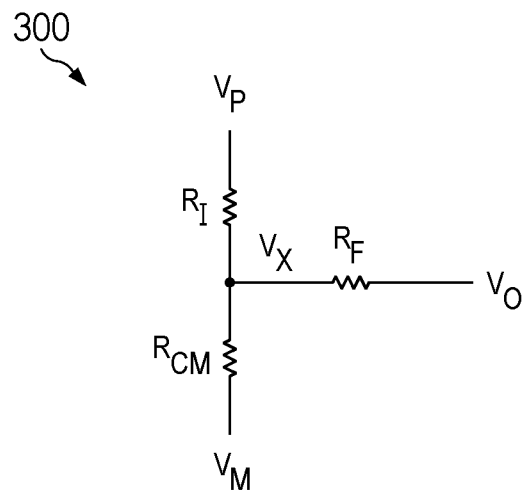
FIG. 3 illustrates a three-resistor star network present within the current sense amplifier system of FIG. 2, in accordance with the present disclosure.

As shown in FIG. 2, current sense amplifier system 200 may also include a calibration system 220, which may be configured to calibrate the various resistors 208, 210, and 214, in order to maximize a common mode rejection ratio of current sense amplifier system 200. To perform calibration, calibration system 220 may assume random mismatches among the various resistor pairs: random mismatch between input resistors 208A and 208B, random mismatch between common mode resistors 214A and 214B, and random mismatch between feedback resistors 210A and 210B. Assuming such random mismatches, and recognizing the existence of a three-resistor star network 300 at each terminal of amplifier 212 as shown in FIG. 3 (where voltage $V_x$ generically represents either of voltages $V_{PX}$ and $V_{MX}$ shown in FIG. 2 and voltage $V_O$ generically represents either of voltages $V_{PO}$ and $V_{MO}$ shown in FIG. 2), a set of mismatch equations for one of such three-resistor star networks may be given by:

$$\frac{\partial V_X}{\partial R_F} \cdot \Delta R_F = R_P[(V_P - V_O)R_{CM} + (V_M - V_O)R_I] \cdot \frac{\Delta R_F}{R_F} \quad (1)$$

$$\frac{\partial V_X}{\partial R_{CM}} \cdot \Delta R_{CM} = R_P[(V_P - V_M)R_F + (V_O - V_M)R_I] \cdot \frac{\Delta R_{CM}}{R_{CM}} \quad (2)$$

$$\frac{\partial V_X}{\partial R_I} \cdot \Delta R_I = R_P[(V_M - V_P)R_F + (V_O - V_P)R_{CM}] \cdot \frac{\Delta R_I}{R_I} \quad (3)$$

where $R_p$ equals the parallel resistance of $R_F$, $R_I$, and $R_{CM}$, $\Delta R_F = R_F - R'_F$, $\Delta R_{CM} = R_{CM} - R'_{CM}$, and $\Delta R_I = R_I - R'_I$.

Adding equations (1), (2), and (3) together and equaling to zero, provides the following, the solution of which would represent a perfect common mode rejection ratio for three-resistor star network 300:

$$R_P[(V_P - V_O)R_{CM} + (V_M - V_O)R_I] \cdot \frac{\Delta R_F}{R_F} +$$

$$R_P[(V_P - V_M)R_F + (V_O - V_M)R_I] \cdot \frac{\Delta R_{CM}}{R_{CM}}$$

$$+ R_P[(V_M - V_P)R_F + (V_O - V_P)R_{CM}] \cdot \frac{\Delta R_I}{R_I} = 0$$

One solution to the foregoing equation is $$\frac{\Delta R_F}{R_F} = \frac{\Delta R_I}{R_I} = \frac{\Delta R_{CM}}{R_{CM}}.$$

However, in reality, neither measuring an individual resistor precisely nor tuning more than two pairs of resistors simultaneously is trivial. Accordingly, calibration system 220 may implement the viable approach of matching the ratio of any combination of two pairs of resistors at a set common target, which may essentially divide a single two-dimensional trimming into two staggered one-dimensional trimmings. To illustrate the approach that may be taken by calibration system 220, reference is made to FIG. 4 which illustrates two three-resistor star networks, 400A and 400B, present within current sense amplifier system 200, in accordance with the present disclosure. During the calibration performed, differential output signal $V_{OUT}$ ($V_{OUT} = V_{PO} - V_{MO}$) will be set to zero (or approximately as close to zero as possible), such that the output terminals of amplifier 212 are at approximately the same voltage (e.g., $V_{PO} = V_{MO} = V_O$). Setting output signal $V_{OUT}$ to zero may allow for calibration to be performed while minimizing human-perceptible artifacts from the calibration being perceived on device 202.

Figure 4:
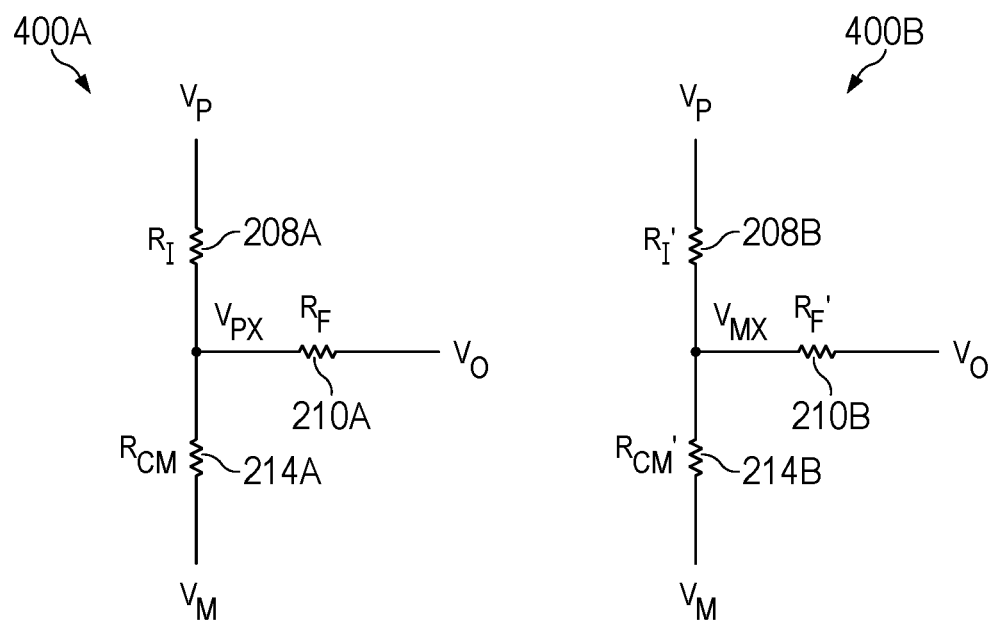
FIG. 4 illustrates two three-resistor star networks present within the current sense amplifier system of FIG. 2, in accordance with the present disclosure.

By setting output signal $V_{OUT}$ to zero during calibration, calibration system 220 in effect applies voltages $V_P$ and $V_M$ to star networks 400A and 400B shown in FIG. 4. Further, calibration system 220 may, during such calibration, trim individual corresponding resistors between the first resistor bank of star network 400A and the second resistor bank of star network 400B to maintain a constant ratio between such corresponding resistors so that the voltage difference at corresponding voltage nodes between star network 400A and star network 400B are zero (e.g., $V_{PX} - V_{MX} = 0$). To achieve this goal, the calibration may ensure that $$\frac{R_F}{R'_F} = \frac{R_I}{R'_I} = \frac{R_{CM}}{R'_{CM}} = C,$$

where C is a constant.

Resistor trim methodologies may demand flexible isolation structures within a resistor network such that calibration system 220 may examine the matching property on any two selected resistor pairs coupled to amplifier 212. The feedback resistor pair 210A and 210B, however, may, in some embodiments, always be selected because it is the only component closing the loop around amplifier 212, so the legitimate choices for isolation must be the input resistor pair 208A and 208B and the common mode resistor pair 210A and 210B. Thus, during calibration, calibration system 220 may first close (e.g, activate, turn on, enable) switches 222 while opening (e.g., deactivating, turning off, disabling) switches 224 to isolate common mode resistors 214A and 214B from interfering with the trimming of input resistors 208A and 208B to make $V_{PX} - V_{MX} = 0$, thus matching the ratio $$\frac{R_I}{R'_I}$$

to the ratio $$\frac{R_F}{R'_F}.$$

After matching the ratio $$\frac{R_I}{R'_I}$$

to the ratio $$\frac{R_F}{R'_F},$$

calibration system 220 may close switches 224 (while either closing switches 222 or leaving switches 222 open) and trim common mode resistors 214A and 214B until again $V_{PX}-V_{MX}=0$, thus matching the ratio $$\frac{R_{CM}}{R'_{CM}}$$

to the ratio $$\frac{R_F}{R'_F}.$$

Alternatively, in some embodiments, calibration system 220 may first match the ratio $$\frac{R_{CM}}{R'_{CM}}$$

to the ratio $$\frac{R_F}{R'_F},$$

then match the ratio $$\frac{R_I}{R'_I}$$

to the ratio $$\frac{R_F}{R'_F}$$

via suitable sequential control of switches 222 and 224 and trimming of resistors 214A, 214B, 208A, and 208B.

Figure 5:
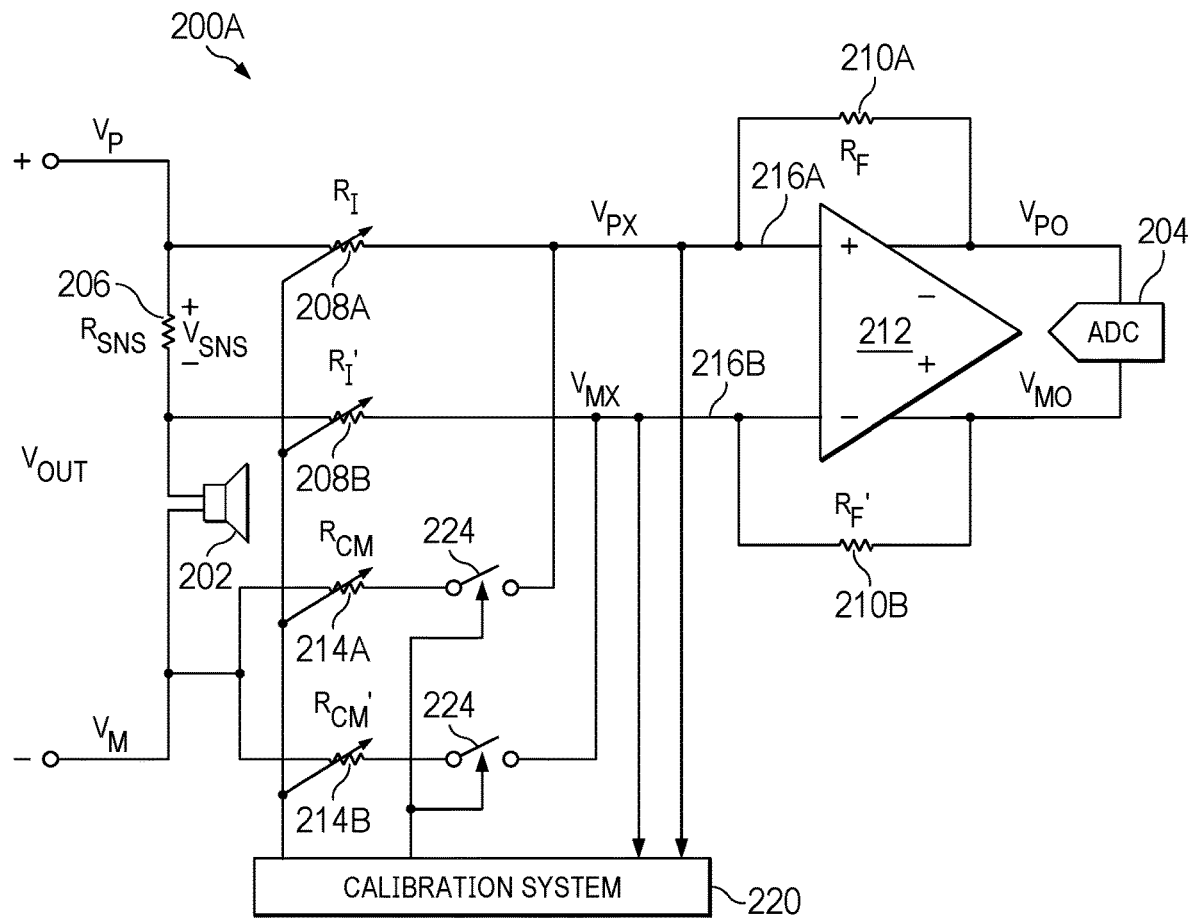
FIG. 5 illustrates a schematic block diagram of another current sense amplifier system, in accordance with the present disclosure.

In alternative embodiments, switches 222 may not be present, such that input resistors 208A and 208B remain coupled to input terminals 216A and 216B during all steps of calibration by calibration system 220, as shown in current sense amplifier system 200A of FIG. 5. In such embodiments, calibration system 220 may first open switches 224 to isolate common mode resistors 214A and 214B from interfering with the trimming of input resistors 208A and 208B to make $V_{PX}-V_{MX}=0$, thus matching the ratio $$\frac{R_I}{R'_I}$$

to the ratio $$\frac{R_F}{R'_F}.$$

After matching the ratio $$\frac{R_I}{R'_I}$$

to the ratio $$\frac{R_F}{R'_F},$$

calibration system 220 may close switches 224 and trim common mode resistors 214A and 214B until again $V_{PX}-V_{MX}=0$, thus matching the ratio $$\frac{R_{CM}}{R'_{CM}}$$

to the ratio $$\frac{R_F}{R'_F}$$

(and also matching the ratio $$\frac{R_{CM}}{R'_{CM}}$$

to the ratio $$\frac{R_I}{R'_I}).$$

Figure 6:
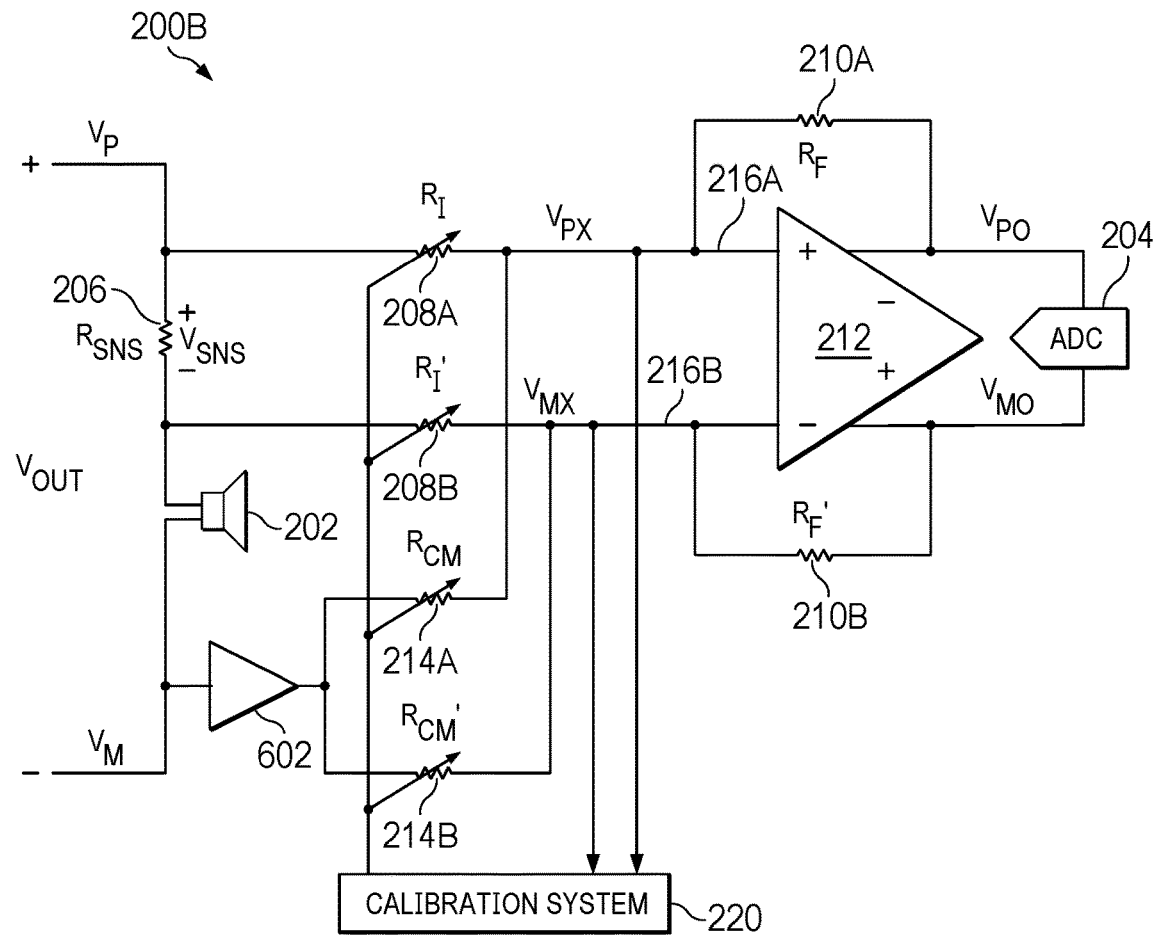
FIG. 6 illustrates a schematic block diagram of yet another current sense amplifier system, in accordance with the present disclosure.

As an alternative embodiment to current sense amplifier system 200A of FIG. 5, isolation of common mode resistors 214A and 214B may also be performed by way of a high-impedance driver 602 coupled between electrical node $V_M$ and common mode resistors 214A and 214B, such that common mode resistors 214A and 214B may be decoupled and isolated from their input side, as shown in current sense amplifier system 200B of FIG. 6.

Figure 7:
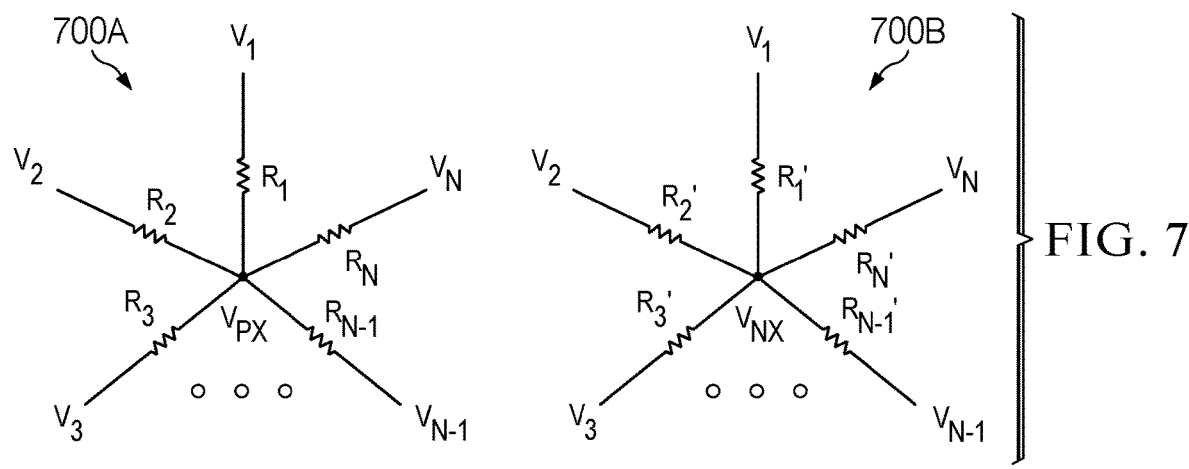
FIG. 7 illustrates two multiple-resistor star networks representing possible resistor couplings to corresponding differential nodes in a fully-differential input system, in accordance with the present disclosure.

While the foregoing contemplates calibrating a fully-differential current sense amplifier system having resistors that can be represented by two three-resistor star configurations, the systems and methods described above can be generalized to any fully differential input system any number of resistors that may be represented as a star network. To that end, FIG. 7 illustrates two multiple-resistor star networks 700A and 700B representing possible resistor couplings to corresponding differential nodes in a fully-differential input system, in accordance with the present disclosure. The fully-differential input system may have a first differential node having a voltage $V_{PX}$ and a second differential node having a voltage $V_{MX}$. The first differential node may have a first resistor bank of resistors $R_1$, $R_2$, $R_3$, ..., $R_{N-1}$, and $R_N$, each coupled at a first terminal to the first differential node and each coupled at their respective second terminals to a respective voltage $V_1$, $V_2$, $V_3$, $V_{N-1}$, and $V_N$. The second differential node may have a second resistor bank of resistors $R_1'$, $R_2'$, $R_3'$, $R_{N-1}'$, and $R_N'$, each coupled at a first terminal to the first differential node and each coupled at their respective second terminals to voltages $V_1$, $V_2$, $V_3$, $V_{N-1}$, and $V_N$, respectively.

During a calibration of such fully-differential input system, a calibration system may cause a voltage (e.g., $V_1$, $V_2$, $V_3$, $V_{N-1}$, or $V_N$) to be applied to the star networks 700A and 700B. Individual resistors corresponding to the applied voltage may be trimmed to maintain a constant ratio such that a voltage difference between the first differential node and the second differential node is zero (e.g., $V_{PX}-V_{MX}=0$). In other words, the goal of calibration may be to make $V_{PX}-V_{MX}=0$ for any $V_i$, where i=1, 2, 3, . . . , N-1, N, such that $$\frac{R_1}{R'_1} = \frac{R_2}{R'_2} = \frac{R_3}{R'_3} = \frac{R_{N-1}}{R'_{N-1}} = \frac{R_N}{R'_N}.$$

Using the systems and methods described herein, a fully-differential input system, include one that may be used in a current sense amplifier system, may include a resistor network having common mode resistors designed to maintain a virtual ground of an amplifier within a comfortable operational region. Further, the resistor network may allow for isolation of any two corresponding pairs of resistors from the rest of the resistors, to allow for independent calibration of resistor pairs to a set common target ratio. Such individual calibrations performed around any two pairs of resistors may maximize a common mode rejection ratio of the fully-differential input system. The fully-differential input system may be calibrated in a manner that ensures a zero or approximate zero voltage is developed across a device to which the fully-differential input system is coupled, thus minimizing human-perceptible artifacts associated with calibration. In addition, the fully-differential input system may be able to carry out an on-chip self-calibration algorithm that allows for quick trim code convergence without the need of external test equipment.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method comprising:
   determining a first voltage of a first node of the fully-differential input system, wherein the first node is coupled at the first node to a plurality of first resistors in a first star configuration, and wherein the plurality of first resistors comprises:
   a first input resistor coupled between the first node and a first input of the amplifier system;
   a first common mode resistor coupled between the first node and a common mode voltage node of the amplifier system; and
   a first feedback resistor coupled between the first node and a first output node of the amplifier system;
   determining a second voltage of a second node of the fully-differential input system, wherein the second node is coupled at the second node to a plurality of second resistors in a second star configuration, each resistor of the plurality of second resistors corresponding to a respective resistor of the plurality of first resistors, and wherein the plurality of second resistors comprises:
   a second input resistor corresponding to the first input resistor and coupled between the second node and a second input of the amplifier system;
   a second common mode resistor corresponding to the first common mode resistor and coupled between the second node and the common mode voltage node;
   a second feedback resistor corresponding to the first feedback resistor and coupled between the second node and a second output node of the amplifier system;

trimming a plurality of individual resistances of the plurality of first resistors and a plurality of individual resistances of the plurality of second resistors in order to maintain a difference of a first voltage at the first node and a second voltage at the second node at a constant level;

trimming one or both of the first input resistor and the second input resistor such that a first ratio of a resistance of the first feedback resistor to a resistance of the second feedback resistor is approximately equal to a second ratio of the first input resistor to a resistance of the second input resistor; and trimming one or both of the first common mode resistor and the second common mode resistor such that the first ratio is approximately equal to a third ratio of the first common mode resistor to a resistance of the second common mode resistor.

2. The method of claim 1, further comprising:

decoupling the first common mode resistor from the first node and the second common mode resistor from the second node prior to and during trimming of one or both of the first input resistor and the second input resistor;

recoupling the first common mode resistor to the first node and the second common mode resistor to the second node prior to and during trimming of one or both of the first common mode resistor and the second common mode resistor.

3. The method of claim 2, wherein:

decoupling the first common mode resistor from the first node comprises deactivating a first switch coupled between the first common mode resistor and the first node; and decoupling the second common mode resistor from the second node comprises deactivating a second switch coupled between the second common mode resistor and the second node.

4. The method of claim 2, wherein:

decoupling the first common mode resistor from the first node comprises activating an impedance element coupled between the common mode voltage node and the first node; and decoupling the second common mode resistor from the second node comprises activating the impedance element or a second impedance element coupled between the common mode voltage node and the second node.

5. The method of claim 1, further comprising:

decoupling the first input resistor from the first node and the second input resistor from the second node prior to and during trimming of one or both of the first common mode resistor and the second common mode resistor;

recoupling the first input resistor to the first node and the second input resistor to the second node prior to and during trimming of one or both of the first common mode resistor and the second common mode resistor.

6. The method of claim 5, wherein:

decoupling the first input resistor from the first node comprises deactivating a first switch coupled between the first input resistor and the first node; and decoupling the second input resistor from the second node comprises deactivating a second switch coupled between the second input resistor and the second node.

7. A system for calibrating a fully-differential input system, comprising:

a first input for receiving a first voltage of a first node of the fully-differential input system, wherein the first node is coupled at the first node to a plurality of first resistors in a first star configuration, and wherein the plurality of first resistors comprises:

a first input resistor coupled between the first node and a first input of the amplifier system;

a first common mode resistor coupled between the first node and a common mode voltage node of the amplifier system; and a first feedback resistor coupled between the first node and a first output node of the amplifier system;

a second input for receiving a second voltage of a second node of the fully-differential input system, wherein the second node is coupled at the second node to a plurality of second resistors in a second star configuration, each resistor of the plurality of second resistors corresponding to a respective resistor of the plurality of first resistors, and wherein the plurality of second resistors comprises:

a second input resistor corresponding to the first input resistor and coupled between the second node and a second input of the amplifier system;

a second common mode resistor corresponding to the first common mode resistor and coupled between the second node and the common mode voltage node;

a second feedback resistor corresponding to the first feedback resistor and coupled between the second node and a second output node of the amplifier system; and a calibration system configured to:

trim a plurality of individual resistances of the plurality of first resistors and a plurality of individual resistances of the plurality of second resistors in order to maintain a difference of a first voltage at the first node and a second voltage at the second node at a constant level;

trim one or both of the first input resistor and the second input resistor such that a first ratio of a resistance of the first feedback resistor to a resistance of the second feedback resistor is approximately equal to a second ratio of the first input resistor to a resistance of the second input resistor; and trim one or both of the first common mode resistor and the second common mode resistor such that the first ratio is approximately equal to a third ratio of the first common mode resistor to a resistance of the second common mode resistor.

8. The system of claim 7, wherein the calibration system is further configured to:

decouple the first common mode resistor from the first node and the second common mode resistor from the second node prior to and during trimming of one or both of the first input resistor and the second input resistor;

recouple the first common mode resistor to the first node and the second common mode resistor to the second node prior to and during trimming of one or both of the first common mode resistor and the second common mode resistor.

9. The system of claim 8, wherein:

decoupling the first common mode resistor from the first node comprises deactivating a first switch coupled between the first common mode resistor and the first node; and decoupling the second common mode resistor from the second node comprises deactivating a second switch coupled between the second common mode resistor and the second node.

10. The system of claim 8, wherein:
- decoupling the first common mode resistor from the first node comprises activating an impedance element coupled between the common mode voltage node and the first node; and
- decoupling the second common mode resistor from the second node comprises activating the impedance element or a second impedance element coupled between the common mode voltage node and the second node.

11. The system of claim 7, wherein the calibration system is further configured to:
- decouple the first input resistor from the first node and the second input resistor from the second node prior to and during trimming of one or both of the first common mode resistor and the second common mode resistor;
- recouple the first input resistor to the first node and the second input resistor to the second node prior to and during trimming of one or both of the first common mode resistor and the second common mode resistor.

12. The system of claim 11, wherein:
- decoupling the first input resistor from the first node comprises deactivating a first switch coupled between the first input resistor and the first node; and
- decoupling the second input resistor from the second node comprises deactivating a second switch coupled between the second input resistor and the second node.

* * * * *